(12) United States Patent
Ogino et al.

(10) Patent No.: US 8,288,079 B2
(45) Date of Patent: Oct. 16, 2012

(54) PHOTOCURABLE RESIN COMPOSITION AND A METHOD FOR FORMING A PATTERN

(75) Inventors: Masahiko Ogino, Hitachi (JP); Makoto Kaji, Hitachi (JP); Hanako Yori, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 422 days.

(21) Appl. No.: 11/622,542

(22) Filed: Jan. 12, 2007

(65) Prior Publication Data
US 2007/0160937 A1    Jul. 12, 2007

(30) Foreign Application Priority Data
Jan. 12, 2006  (JP) ................................. 2006-004755

(51) Int. Cl.
*G03F 7/028* (2006.01)
*B29C 35/08* (2006.01)

(52) U.S. Cl. .................. 430/281.1; 430/288.1; 264/496; 522/6

(58) Field of Classification Search ............... 430/281.1, 430/288.1; 264/401, 496; 522/6
See application file for complete search history.

(56) References Cited

U.S. PATENT DOCUMENTS

| | | | |
|---|---|---|---|
| 3,930,865 A * | 1/1976 | Faust | 430/283.1 |
| 4,019,972 A * | 4/1977 | Faust et al. | 430/260 |
| 4,564,580 A * | 1/1986 | Ichimura et al. | 430/281.1 |
| 4,614,705 A | 9/1986 | Umehara | |
| 5,250,391 A * | 10/1993 | Miller | 430/286.1 |
| 5,259,926 A | 11/1993 | Kuwabara et al. | |
| 5,352,713 A * | 10/1994 | Snyder et al. | 522/40 |
| 5,686,220 A * | 11/1997 | Tsuda | 430/138 |
| 5,772,905 A | 6/1998 | Chou | |
| 7,416,764 B2 * | 8/2008 | Matsumoto et al. | 427/407.1 |
| 8,025,833 B2 * | 9/2011 | Kodama et al. | 264/496 |
| 8,076,386 B2 * | 12/2011 | Xu et al. | 522/1 |
| 2003/0143486 A1 * | 7/2003 | Kubota et al. | 430/281.1 |
| 2004/0110856 A1 * | 6/2004 | Young et al. | 522/6 |
| 2005/0165141 A1 * | 7/2005 | Wolf et al. | 524/99 |
| 2005/0187339 A1 * | 8/2005 | Xu et al. | 524/556 |
| 2006/0035034 A1 * | 2/2006 | Matsumoto et al. | 427/487 |
| 2008/0107870 A1 | 5/2008 | Kawaguchi et al. | |

FOREIGN PATENT DOCUMENTS

| | | |
|---|---|---|
| EP | 0 759 448 | 2/1997 |
| EP | 0 889 465 | 1/1999 |
| EP | 1 142 966 | 10/2001 |
| JP | 05-098112 | 4/1993 |
| JP | 05-100423 | 4/1993 |
| JP | 10-153864 | 6/1998 |
| JP | 2001-503797 | 3/2001 |
| JP | 2002-156763 | 5/2002 |
| WO | WO 98/20373 | 5/1998 |
| WO | WO 01/85812 | 11/2001 |
| WO | WO 2006/114958 | 11/2006 |

OTHER PUBLICATIONS

BASF Technical Data Sheet, N-vinyl Pyrrolidone, Feb. 1997.*
S. Chou, et al., "Imprint of Sub-25 NM Vias and Trenches in Polymers", Appl. Phys. Ltt. 67 (21), pp. 3114-3116, Nov. 20, 1995.
Y. Kurashima, et al., "Evaluation of Line Edge Roughness in Nanoimprint Lithography Using Photocurable Polymer", Jpn. J. Phys., vol. 42, pp. 3871-3873, Jun. 2003.
European Search Report for Application No. EP 07 00 0547, dated Mar. 29, 2007.
Japanese Official Action dated Dec. 21, 2010, for JP Application No. 2006-004755.

* cited by examiner

*Primary Examiner* — John Chu
(74) *Attorney, Agent, or Firm* — Antonelli, Terry, Stout & Kraus, LLP.

(57) ABSTRACT

A photocurable resin composition containing a photopolymerization initiator and a (meth)acrylate monomer and/or oligomer, said (meth)acrylate monomer or oligomer having a cyclic structure, in which the atomic weight of carbon (Mcr) in said cyclic structure and the number of whole carbon atoms (MTOT) in said composition have the relation of Mcr/MTOT>0.1, or the total number (N) of carbon atoms in said cyclic structure, the total number of carbon atoms (Nc) in said composition and the total number of oxygen atoms (No) have the relation of N/(Nc−No)<4, and the composition has a kinetic viscosity of 10 mPa·s or below. This low-viscosity photocurable resin composition has excellent dry etching resistance and is applicable to optical nanoprinting.

21 Claims, 1 Drawing Sheet

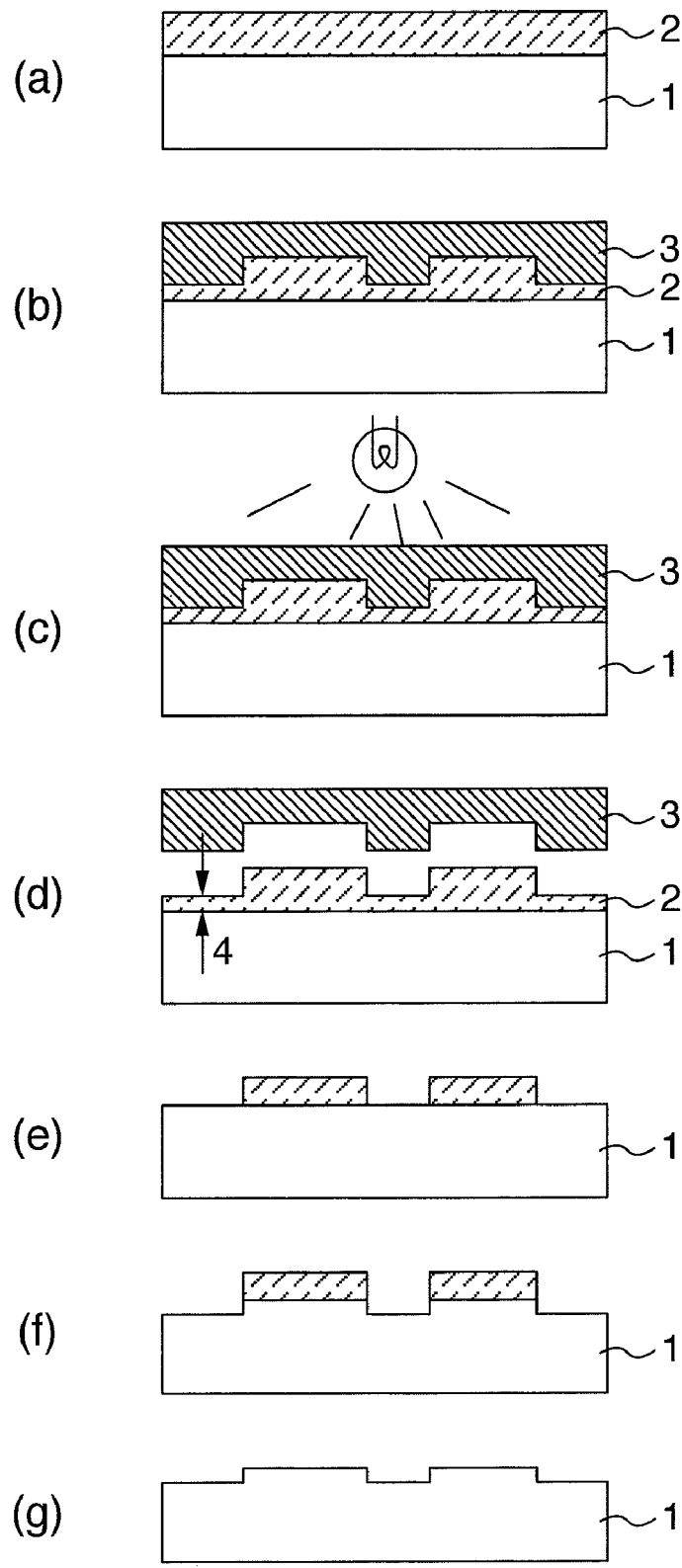

PHOTOCURABLE RESIN COMPOSITION AND A METHOD FOR FORMING A PATTERN

BACKGROUND OF THE INVENTION

The present invention relates to a photocurable resin composition useful for forming a fine pattern, and a method for forming a pattern using such a resin composition.

In recent years, there have been seen rapid advancement in miniaturization and integration of semiconductor integrated circuits, and efforts have been made for higher precision of photolithography applied as a pattern transfer technique for realizing finer working of such circuits. However, the conventional working process has approached the wavelength of the light source used for light exposure, and the lithographical techniques have come close to the limitation. In order to push forward with further advancement of miniaturization and higher precision, an electron beam direct writing system, which is a kind of charged corpuscular beam devices, has come to be used superseding the conventional lithographical techniques.

Pattern forming using the electron beams, unlike the blanket exposure method in pattern forming using a light source such as i-beam or excimer laser, is a method in which the mask patterns are drawn. Therefore, the greater the number of patterns to be drawn, the more time is required for exposure (drawing), hence a longer time for pattern forming, and this has been a drawback to this method. Accordingly, as the degree of integration is elevated drastically, with the memory capacity increasing to, say, 256 megabytes and further up to 1 and then to 4 gigabytes, the patterns are also made dense correspondingly to so much elongate the time for pattern forming, and it is feared that this may lead to excess deterioration of throughput. In view of this, in order to realize higher speed operation of the electron beam direct writing devices, efforts have been made for the direct writing of a blanket pattern irradiation method in which the masks of various configurations are used in combination, and electron beams are applied to them en bloc to form electron beams of intricate configurations. As a consequence, while higher pattern densification has been advanced, enlargement in size and structural complication of the electron beam direct writing devices have become essential, resulting in a disadvantage of high production cost.

Techniques for forming the fine patterns at low cost are disclosed in Patent Documents 1 and 2 listed below. In these techniques, a mold having raggedness of the same pattern as that formed on the substrate is impressed to a resin layer formed on the surface of a transfer substrate to thereby transfer the specified pattern. Particularly, according to the nanoimprinting techniques disclosed in Patent Document 2 and Non-Patent Document 1, transfer of fine structures of less than 25 nanometers in size is made possible by using a silicon wafer as the mold.

[Patent Document 1] U.S. Pat. No. 5,259,926
[Patent Document 2] U.S. Pat. No. 5,772,905
[Patent Document 3] JP-A H5-98112
[Patent Document 4] JP-A H5-100423
[Patent Document 5] JP-A 2002-156763
[Patent Document 6] JP-A H10-153864
[Non-Patent Document 1] S. Y. Chou et al:
Appl. Phys. Lett., Vol. 67, p. 3114 (1995)
[Non-Patent Document 2] Yuichi Kurashima:
Jpn. J. Appln. Phys., Vol. 42, p. 3871

The nanoimprinting techniques can be roughly divided into two types depending on the material to be transferred. One type is a thermal nanoimprinting technique according to which the material to be transferred is heated to make plastic deformation by the mold, and then the material is cooled to form a pattern. Another type comprises an optical nanoimprinting technique in which after a substrate has been coated with a photocurable resin which is liquid at room temperature, a light-transmittable mold is pressed against the resin and light is applied to cause curing of the resin on the substrate to form a pattern. Especially, the optical nanoimprinting technique, as it enables pattern forming at room temperature, has the advantage in that there scarcely takes place strain due to difference in linear expansion coefficient between the substrate and the mold on heating, allowing high-precision pattern forming, so that attention is focused on this technique as a substitute for conventional semiconductor lithography. Regarding the photocurable resins usable in such optical nanoprinting systems, PAK-01 (product by Toyo Gosei KK) is introduced in Non-Patent Document 2.

Also, with reference to the photocurable resins, Patent Documents 3 and 4 disclose the etching resist compositions incorporated with photopolymerization initiators using acrylate monomers as starting material. Patent Documents 5 and 6 disclose etching resist compositions with excellent etching resistance.

SUMMARY OF THE INVENTION

It is an object of the present invention to provide a photocurable nanoprinting resin for high-precision working of the substrates using the optical nanoprinting techniques, said resin being low in viscosity, enabling thinning of the base layer and having excellent dry etching resistance.

The present invention provides a photocurable resin composition containing a (meth)acrylate monomer and/or oligomer having a cyclic structure and a photopolymerization initiator, in which the carbon atoms in said cyclic structure and the whole carbon atoms in the composition satisfy at least one of the following relations (1) and (2):

(1) The relation between the total atomic weight of the carbon atoms (Mcr) in said cyclic structure and the total atomic weight of whole carbon (MTOT) in the composition meets Mcr/MTOT>0.1.

(2) The relation between the total number of carbon atoms (N) in said cyclic structure, the number of whole carbon atoms (Nc) in the composition and the total number of oxygen atoms (No) meets N/(Nc−No)<4.

It is also envisaged in this invention to provide a method for forming a pattern in which a fine pattern formed on a mold is transferred to a film of said photocurable resin composition.

By using the photocurable resin composition according to the present invention, it is possible to provide a photocurable nanoprinting resin for high-precision working of the substrates using the optical nanoprinting techniques, said nanoprinting resin being low in viscosity, enabling thinning of the base layer and having excellent dry etching resistance. Consequently, high-precision working of the substrates by using optical nanoprinting techniques is realized.

BRIEF DESCRIPTION OF THE DRAWING

FIG. 1 is a flow sheet of the optical nanoprinting process. In FIG. 1, the following nomenclature is used throughout: 1: substrate, 2: photocurable resin, 3: mold, 4: base layer.

DETAILED DESCRIPTION OF THE INVENTION

Before describing the embodiments of the present invention, some important matters related to the present invention are explained. First, the process in application of optical nanoprinting techniques to fine working of substrates is as described stepwise below, and its flow sheet is shown in FIG. 1.

(a) Substrate 1 is coated with a photocurable resin composition film 2.
(b) A mold 3 having a fine pattern formed on its surface is pressed against the surface of the photocurable resin composition film.
(c) Ultraviolet light is applied from above the mold to cure the photocurable resin composition.
(d) The mold 3 is separated from the photocurable resin composition film 2.
(e) The base layer 4 is removed.
(f) The substrate 1 is worked by etching or other means with the photocured resin film 2 masked.
(g) The photocured resin film 2 is removed.

The above process can form a fine pattern on the substrate surface using the optical nanoprinting techniques.

The photocurable resins disclosed in Patent Documents 3 and 4 are patterned by the photolithographical method. In the photolithographical method, patterning is performed by producing the solubility for the development by making use of the difference in contrast between the light irradiated portion and the non-irradiated portion. In Patent Documents 3 and 4 are also disclosed the photocurable resins used for forming the shadow masks of the cathode-ray tubes. Here, an etching mask is formed by applying a photocurable resin on both sides of a substrate and carrying out exposure and development using a negative film as a mask. Further, after wet half etching, one of the resists is removed and a photocurable resin is again applied as a backing resin material, this resin being flown into the 100-400 μm wide etching grooves and photocured. Viscosity of the photocurable resin compositions disclosed in the above documents is defined in the range of 2,000 to 4,000 mPa·s in consideration of their filling capability in the 100-200 μm grooves. According to the optical nanoprinting techniques, on the other hand, a photocurable resin, which is liquid at room temperature, is applied on a substrate, then a mold is pressed against the liquid photocurable resin, letting the resin flow to the nanoscale rugged pattern of the mold, and the photocurable resin is solidified by irradiation with light to form a pattern.

As understood from the above process using the optical nanoprinting techniques, when forming a pattern with high precision, it is very important to thin down the base layer formed between the convex portion of the mold and the substrate. When this base layer is removed, the pattern that must be left finally is also worked simultaneously, so that if the film thickness of this portion is large, unnecessary working may be made on this pattern portion, resulting in reduced pattern precision.

Relating to the film thickness h after pressing of the resin held by two flat plates, there is known the following expression of relation as Stephan's formula:

$$h=H/\sqrt{((t/\tau)+1)}, \tau=3\mu S/(2\pi PH^2) \quad \text{expression of relation 1}$$

wherein H: initial film thickness, t: pressing time, μ: resin viscosity, S: pressing area, P: pressing force.

As apparent from the above formula, it is effective to minimize the initial film thickness H or lessen the resin viscosity μ for thinning the base layer (resin film formed between the convex portion of the mold and the substrate after pressing).

In the case of the photocurable resin PAK-01 disclosed in Non-Patent Document 2, this resin is coated on a quartz substrate, then an Si mold is pressed against it and light is applied from the quartz substrate side to transfer the pattern of the Si mold onto the quartz substrate. This document 2 stops short of describing further than the step (d) in the above-stated optical nanoprinting process and is silent on working of the substrate. The present inventors conducted investigations with the object of substrate working with PAK-01. The resin, adjusted to a kinetic viscosity of 72 mPa·s, was spin coated on a substrate, and then a 0.1 μm deep mold was pressed against the coating film, followed by irradiation with light. As a result, the base layer thickness became about 2 μm and the pattern height was 0.1 μm, so that the pattern vanished when the base layer was removed, making it unable to form a resist mask for substrate working.

It was thus impossible to thin the base layer because of large initial film thickness and high viscosity, and accordingly, this resin could not be used as a resist material for optical nanoprinting for substrate working. It is obvious that no patterning by nanoprinting is possible by using the high-viscosity photocurable resins disclosed in Patent Documents 3 and 4 are used.

Dry etching is an effective method for substrate working. In carrying out substrate working using the optical nanoprinting techniques, a photocurable resin is used as a resist mask during dry etching, so that the resin used is required to have resistance to etching. Patent Documents 5 and 6 disclose the techniques for improving etching resistance by incorporating a polymer having an alicyclic hydrocarbon skeleton.

In the case of these resist materials, however, a corresponding polymer is dissolved in an organic solvent, then the resulting solution is applied on a substrate and the coated substrate is passed through a baking step to form a solid resist film. This film is further subjected to the steps of exposure and development to finally form a resist mask. But in the optical nanoprinting techniques, as stated above, a photocurable resin composition, which is liquid at room temperature, is applied for coating on a substrate, then a mold is pressed against the liquid-state photocurable resin to let the resin flow to the rugged portion of the mold, and the liquid photocurable resin is solidified by irradiation with light to form a pattern. Therefore, the process does not function unless the resin film formed on the substrate is liquid. Thus, the conventional photocurable resins disclosed in Patent Documents 5 and 6 can hardly be applied as a resin for optical nanoprinting.

The mold used in the present invention has a fine pattern to be transferred, and the method for forming such a pattern on a stamper is not specifically defined. It may be properly selected according to the desired level of working precision, such as photolithography or electron beam direct writing. As the mold material, there can be used any of those having enough strength and required precision workability, which include silicon wafer, various kinds of metallic material, glass, quartz, ceramic and plastic. Specifically, Si, SiC, SiN, polycrystalline Si, Ni, Cr, Cu and the materials containing one or more of these elements are preferably used. Quartz is especially preferred as it has high transparency and allows efficient light irradiation to the resin when it is photocured. In case of using an opaque material, light is applied via the side opposite from the mold to cure the resin.

Also, the mold surface is preferably subjected to a releasing treatment for preventing resin from adhering to the mold surface. For such a surface treatment, preferably a silicone-based release agent or the like, such as a fluorine compound, is applied on the surface to a thickness of several nm.

In the present invention, the substrate material is not specifically defined but required to have specified strength. Preferred examples are silicon, various kinds of metallic material, glass, ceramic and plastic. When the mold is opaque, a transparent substrate may be used.

The (meth)acrylate compositions usable in the present invention include, though not limited to, the following: phenoxy glycol (meth)acrylate, phenoxyethylene glycol (meth) acrylate, phenoxypolyethylene glycol (meth)acrylate, methoxyethylene glycol (meth)acrylate, methoxypolyethylene glycol (meth)acrylate, biphenyl (meth)acrylate, isobornyl (meth)acrylate, octoxypolyethylene glycol (meth)acrylate, 2-hydroxy-3-phenoxypropyl (meth)acrylate, isostearyl (meth)acrylate, lauryl (meth)acrylate, polyethylene glycol di(meth)acrylate, ethoxylated bisphenol A di(meth)acrylate, propoxylated bisphenol A di(meth)acrylate, 1,10-decanediol di(meth)acrylate, cyclodecane dimethanol (meth)acrylate, ethoxylated 2-methyl-1,3-propanediol di(meth)acrylate, neopenyl glycol di(meth)acrylate, 2-hydroxy-3-acryloixypropyl methacrylate, propoxylated ethoxylated bisphenol A di(meth)acrylate, 1,6-hexanediol di(meth)acrylate, 1,9-nonanediol di(meth)acrylate, dipropylene glycol diacrylate, tripropylene glycol di(meth)acrylate, polypropylene glycol di(meth)acrylate, ethylene glycol di(meth)acrylate, triethylene glycol di(meth)acrylate, tetraethylene glycol di(meth) acrylate, ethoxylated isocyanuric acid triacrylate, ethoxylated trimethylolpropane tri(meth)acrylate, trimethylolpropane (meth)acrylate, propoxylated trimethylolpropane triacrylate, pentaerythritol triacrylate, ethoxylated pentaerythritol tetra(meth)acrylate, ditrimethylolpropane tetra(meth)acrylate, propoxylated pentaerythritol tetra (meth)acrylate, pentaerythritol tetra(meth)acrylate, and dipentaerithritol hexa(meth)acrylate.

Basically, any of the compounds having an acrylate or methacrylate group at the molecular chain terminal can be used in the present invention. Of these (meth)acrylate compounds, those having a cyclic structure in the molecular chain are especially preferred as they can provide excellent dry etching resistance.

Among the preferred examples are benzyl (meth)acrylate, cyclohexyl (meth)acrylate, cyclopentanyl (meth)acrylate, cyclopentenyl (meth)acrylate and adamantly (meth)acrylate. Ethoxylated bisphenol A di(meth)acrylates are also preferable, and those whose unit number of ethoxy groups in the structure is 4 to 17 are especially preferred because of low viscosity. These (meth)acrylate compounds can be used either singly or in proper combination. Beside the above-shown monomers, the (meth)acrylate oligomers produced by polymerizing a plural number of these monomers can also be applied.

The photocurable resin used in the present invention may contain a reactive diluent. Examples of the reactive diluents usable in the present invention include N-vinylpyrrolidone, acryloyl morpholine, N,N-dimethylacrylamide, N-methylolacrylamide and N,N-dimethylaminopropylacrylamide. These diluents may be used alone or in proper combination. Of these diluents, N-vinylpyrrolidone is particularly preferred for use as a reactive diluent because of low viscosity.

As the photopolymerization initiator in the present invention, there can be used, for instance, the following: 2,2-dimethoxy-1,2-diphenylethane-1-one, 1-hydroxy-cyclohexyl-phenyl-ketone, 2-hydroxy-2-methyl-1-phenyl-propane-1-one, benzophenone, 1-[4-(2-hydroxyethoxy)-phenyl]-2-hydroxy-2-methyl-1-propane-1-one, 2-methyl-1-[4-(methylthio)phenyl]-2-morpholinopropane-1-one, 2-benzyl-2-dimethylamino-1-(4-morpholinophenyl)-butanone-1, bis(2,6-dimethoxybenzoyl)-2,4,4-trimethyl-pentylphosphine oxide, 2-hydroxy-2-methyl-1-phenyl-propane-1-one, bis(2,4,6-trimethylbenzoyl)-phenylphosphine oxide, and bis($\eta^5$-2,4-cyclopentadiene-1-yl)-bis(2,6-difluoro-3-(1H-pyrrole-1-yl)-phenyl)titanium. These photopolymerization initiators may be used singly or as a mixture of two or more. Also, they can be used in combination with a known photopolymerization accelerator or sensitizer. The compounding ratio of the photopolymerization initiator in the present invention is preferably 0.1 to 5.0% by weight.

The photocurable resin composition of the present invention preferably contains a surfactant. As the fluoric surfactants, perfluoroalkyl-containing oligomers and solutions of such oligomers dissolved in a solvent can be used. Also usable are those oligomers in which the hydrocarbon chain is bonded to the perfluoroalkyl chain. It is also possible to use those of a structure in which an ethoxy or methoxy chain or a siloxane is bonded to the perfluoroalkyl chain. Commercially available fluoric surfactants can also be used. Such a surfactant may be added in an amount of 0.01 to 1% by weight of the whole composition.

In the present invention, the said (meth)acrylate compounds are used as a monomer or an oligomer, and the whole composition needs to stay liquid at normal temperature. In the present invention, by providing particularly a solvent-free composition, it is possible to prevent shrinkage or deformation during the pattern forming operation, and this makes it possible to form a pattern with remarkably high precision. It is desirable, therefore, that not only the monomers but also the oligomers used in the present invention are liquid at normal temperature.

The photocurable resin composition of the present invention comprises as principal components a (meth)acrylate, a reactive diluent and a photopolymerization initiator such as mentioned above, and may contain, as required, small quantities of additives such as organic solvent, adhesion promoter such as silane coupling agent, and polymerization inhibitors such as hydroquinone, hydroquinone monomethyl ether and pyrogallol. The composition, however, is preferably a solventless type as mentioned above. The reactive diluent can function as a solvent, but as it is integrated into the composition in the course of curing, the composition is called a solventless type even when a reactive diluent is added in the present invention.

The "cyclic structure" possessed by the (meth)acrylates in the composition of the present invention is the structure of the organic compounds having cyclic atomic arrangement in the structural formula like, for instance, benzene ring or cyclo ring, and such compounds include not only carbocyclic compounds but also heterocyclic compounds. They also include the polycyclic compounds and spiro compounds in which two or more rings are integrated by sharing two or more atoms with each other.

EXAMPLES

The present invention is further illustrated with reference to the embodiments thereof, but it is to be understood that the present invention is not limited to these embodiments. In the following descriptions, all "parts" and "percents (%)" are by weight unless otherwise noted.

Example 1

(Determination of Film Thickness)

1 g of a sample solution was dropped onto a 4-inch silicon wafer, and after preliminary spinning at 500 rpm/10 s, the wafer was spun normally at 7,000 rpm/90 s. Thereafter, in order to prevent improper curing due to oxygen inhibition or other causes, ultraviolet light with a wavelength of 365 nm was applied at 5 J/cm$^2$ in an inert atmosphere to form a resin film. Part of the cured film was cut out, and the difference in level between the substrate and the cured film surface was measured by a level difference meter (mfd. by Tencor), from which the film thickness was determined.

(Determination of Kinetic Viscosity)

Using an E-type viscometer (mfd. by Tokyo Keiki KK), 1.2 cc of an evaluation sample was poured into a sample cup, then the sample cup was set in position in the viscometer and the rotor was spun to measure viscosity of the sample. Measurement of viscosity was conducted at 23° C. in all runs.

(Evaluation of Etching Rate)

A resin film was made in the same way as conducted in determination of film thickness described above, and part of the film was masked with a polyimide adhesive tape to prepare a sample. This sample was placed in a chamber for treatment by a dry etcher (mfd. by Shinko Seiki KK) and treated therein for 60 seconds under the conditions of 0.4 Pa (pressure) and 250 W (output) while flowing $CF_4$ gas at a rate of 10 ml/min, after which the masking tape was stripped off and the level difference between the treated area and the non-treated area was measured to thereby evaluate the etching rate.

(Evaluation of Pattern Formability)

A resin was spin coated, by preliminary spinning at 500 rpm/10 s and successive normal spinning at 7,000 rpm/90 s, on a substrate having an $SiO_2$ film formed thereon, followed by imprinting with a mold with a molding pitch of 200 nm, a line width of 80 nm and a depth of 200 nm. Then, after removing the base layer, the $SiO_2$ film was etched and the obtained pattern form was evaluated.

(Preparation Method)

The procedure of preparation is as follows:
1) A reaction initiator is weighed out.
2) A photoreaction initiator is incorporated in a (meth)acrylate compound and dissolved with stirring.
3) A fluoric surfactant is weighed out.
4) It is fed into the mixture.
5) The mixture is stirred by a mixing rotor for one hour.
6) It is further stirred in a supersonic water tank for 5 minutes.
7) The solution is filtered by a 0.2 μm membrane filter.

A photocurable resin composition was prepared by blending 10 parts of BPE-500 (product by Shin-Nakamura Chemical Co., Ltd.) as (meth)acrylate compound, 60 parts of 1G (product by Shin-Nakamura Chemical Co., Ltd.) as ethylene glycol di(meth)acrylate, 30 parts of LIGHT-ESTER BZ (product by Kyoeisha Chemical Co., Ltd.) as benzyl (meth)acrylate, 5 parts of Irgacure 1-907 (product by Ciba Specialty Chemicals Inc.) as photopolymerization initiator and 0.1 part of MEGAFAC R-08 (product by Dainippon Ink and Chemicals, Inc.) as fluoric surfactant. Viscosity of this resin, its film thickness and etching rate were evaluated. As the viscosity was below 10 mPa·s and the etching rate was also not higher than 2 nm/s, a good pattern could be formed.

Results are shown in Table 1. In the table, "Ohnishi P" means Ohnishi parameter which is expressed by N/(Nc−No), and "Ring P" stands for Ring parameter expressed by Mcr/MTOT. Also in the table, ○ mark indicates that the formed pattern was normal, Δ mark denotes occurrence of abnormality at part of the pattern (e.g., generation of a portion where the pattern won't be cut even if the mold is pressed, due to too high viscosity of the composition), and X mark signifies that the pattern could not be formed. Unit of the etching rate is nm/sec.

Example 2

A photocurable resin comprising 10 parts of BPE-500 (product by Shin-Nakamura Chemical Co., Ltd.) as (meth)acrylate compound, 30 parts of 1G (product by Shin-Nakamura Chemical Co., Ltd.) as ethylene glycol di(meth)acrylate, 60 parts of LIGHT-ESTER BZ (product by Kyoeisha Chemical Co., Ltd.) as benzyl(meth)acrylate, 5 parts of Irgacure I-907 (product by Ciba Specialty Chemicals, Inc.) as photopolymerization initiator and 0.1 part of MEGAFAC R-08 (product by Dainippon Ink and Chemicals, Inc.) as fluoric surfactant was prepared, and viscosity of this resin, its film thickness and etching rate were evaluated. As its viscosity was below 10 mPa·s and the etching rate was also below 2 nm/s, a good pattern could be formed. Results are shown in Table 1.

Example 3

A photocurable resin comprising 10 parts of BPE-500 (product by Shin-Nakamura Chemical Co., Ltd.) as (meth)acrylate compound, 30 parts of 1G (product by Shin-Nakamura Chemical Co., Ltd.) as ethylene glycol di(meth)acrylate, 60 parts of VISCOAT 155 (product by Osaka Organic Chemical Co., Ltd.) as (meth)acrylate, 5 parts of Irgacure I-907 (product by Ciba Specialty Chemicals, Inc.) as photopolymerization initiator, and 0.1 part of MEGAFAC R-08 (product by Dainippon Ink and Chemicals, Inc.) as fluoric surfactant was prepared, and its viscosity, film thickness and etching rate were evaluated. As the viscosity was below 10 mPa·s and the etching rate was also below 2 nm/s, a good pattern could be formed. Results are shown in Table 1.

Example 4

A photocurable resin composition comprising 10 parts of BPE-500 (product by Shin-Nakamura Chemical Co., Ltd.) as (meth)acrylate compound, 40 parts of 1G (product by Shin-Nakamura Chemical Co., Ltd.) as ethylene glycol di(meth)acrylate, 50 parts of FA513A (product by Hitachi Chemical Co., Ltd. as cyclopentanyl(meth)acrylate, 5 parts of Irgacure I-907 (product by Ciba Specialty Chemicals, Inc.) as photopolymerization initiator, and 0.1 part of MEGAFAC R-08 (product by Dainippon Ink and Chemicals, Inc.) as fluoric surfactant was prepared, and its viscosity, film thickness and etching rate were evaluated. As the viscosity was not higher than 10 mPa·s and the etching rate was also below 2 nm/s, a good pattern could be formed. Results are shown in Table 1.

Example 5

A photocurable resin composition comprising 10 parts of BPE-500 (product by Shin-Nakamura Chemical Co., Ltd.) as (meth)acrylate compound, 30 parts of 1G (product by Shin-Nakamura Chemical Co., Ltd.) as ethylene glycol di(meth)acrylate, 60 parts of FA513A (product by Hitachi Chemical Co., Ltd.) as cyclopentanyl(meth)acrylate, 5 parts of Irgacure I-907 (product by Ciba Specialty Chemicals, Inc.) as photopolymerization initiator, and 0.1 part of MEGAFAC R-08 (product by Dainippon Ink and Chemicals, Inc.) as fluoric surfactant was prepared, and its viscosity, film thickness and etching rate were evaluated. As the viscosity was below 10 mPa·s and the etching rate was also below 2 nm/s, a good pattern could be formed. Results are shown in Table 1.

Example 6

A photocurable resin composition comprising 10 parts of BPE-500 (product by Shin-Nakamura Chemical Co., Ltd.) as (meth)acrylate compound, 30 parts of 1G (product by Shin-Nakamura Chemical Co., Ltd.) as ethylene glycol di(meth)acrylate, 60 parts of FA511A (product by Hitachi Chemical Co., Ltd.) as cyclopentenyl(meth)acrylate, 5 parts of Irgacure I-907 (product by Ciba Specialty Chemicals, Inc.) as photopolymerization initiator, and 0.1 part of MEGAFAC R-08 (product by Dainippon Ink and Chemicals, Inc.) as fluoric surfactant was prepared, and its viscosity, film thickness and etching rate were evaluated. As the viscosity was below 10 mPa·s and the etching rate was also below 2 nm/s, a good pattern could be formed. Results are shown in Table 1.

Example 7

A photocurable resin composition comprising 10 parts of BPE-500 (product by Shin-Nakamura Chemical Co., Ltd.) as (meth)acrylate compound, 60 parts of 1G (product by Shin-Nakamura Chemical Co., Ltd.) as ethylene glycol di(meth)acrylate, 30 parts of adamantyl methacrylate (internal synthetic product) as adamantly (meth)acrylate, 5 parts of Irgacure I-907 (product by Ciba Specialty Chemicals, Inc.) as photopolymerization initiator, and 0.1 part of MEGAFAC R-08 (product by Dainippon Ink and Chemicals, Inc.) as fluoric surfactant was prepared, and viscosity of this resin, film thickness and etching rate were evaluated. As the viscosity was below 10 mPa·s and the etching rate was also below 2 nm/s, a good pattern could be formed. Results are shown in Table 1.

Example 8

A photocurable resin composition comprising 10 parts of BPE-500 (product by Shin-Nakamura Chemical Co., Ltd.) as (meth)acrylate compound, 50 parts of 1G (product by Shin-Nakamura Chemical Co., Ltd.) as ethylene glycol di(meth)acrylate, 40 parts of adamantyl methacrylate (internal synthetic) as adamantly (meth)acrylate, 5 parts of Irgacure I-907 (product by Ciba Specialty Chemicals, Inc.) as photopolymerization initiator, and 0.1 part of MEGAFAC R-08 (product by Dainippon Ink and Chemicals, Inc.) as fluoric surfactant was prepared, and its viscosity, film thickness and etching rate were evaluated. As the kinetic viscosity of this resin was below 10 mPa·s and the etching rate was also below 2 nm/s, a good pattern could be formed. Results are shown in Table 1.

Example 9

A photocurable resin composition comprising 10 parts of BPE-500 (product by Shin-Nakamura Chemical Co., Ltd.) as (meth)acrylate compound, 60 parts of 1G (product by Shin-Nakamura Chemical Co., Ltd.) as ethylene glycol di(meth)acrylate, 30 parts of adamantyl acrylate (internal synthetic product) as adamantly (meth)acrylate, 5 parts of Irgacure I-907 (product by Ciba Specialty Chemicals, Inc.) as photopolymerization initiator, and 0.1 part of MEGAFAC R-08 (product by Dainippon Ink and Chemicals, Inc.) as fluoric surfactant was prepared, and its viscosity, film thickness and etching rate were evaluated. As the kinetic viscosity was below 10 mPa·s and the etching rate was also below 2 nm/s, a good pattern could be formed. Results are shown in Table 1.

Example 10

A photocurable resin composition comprising 10 parts of BPE-500 (product by Shin-Nakamura Chemical Co., Ltd.) as (meth)acrylate compound, 30 parts of A-NPG (product by Shin-Nakamura Chemical Co., Ltd.) as ethylene glycol di(meth)acrylate, 60 parts of VISCOAT 160 (product by Osaka Organic Chemical Co., Ltd.) as benzyl (meth)acrylate, 5 parts of Irgacure I-907 (product by Ciba Specialty Chemicals, Inc.) as photopolymerization initiator, and 0.1 part of MEGAFAC R-08 (product by Dainippon Ink and Chemicals, Inc.) as fluoric surfactant was prepared, and its viscosity, film thickness and etching rate were evaluated. As the kinetic viscosity was below 10 mPa·s and the etching rate was also below 2 nm/x, a good pattern could be formed. Results are shown in Table 1.

Example 11

A photocurable resin composition comprising 30 parts of A-NPG (product by Shin-Nakamura Chemical Co., Ltd.) as ethylene glycol di(meth)acrylate, 70 parts of VISCOAT 160 (product by Osaka Organic Chemical Co., Ltd.) as benzyl (meth)acrylate, 5 parts of Irgacure I-907 (product by Ciba Specialty Chemicals, Inc.) as photopolymerization initiator, and 0.1 part of MEGAFAC R-08 (product by Dainippon Ink and Chemicals, Inc.) as fluoric surfactant was prepared, and its viscosity, film thickness and etching rate were evaluated. As the kinetic viscosity of this resin was below 10 mPa·s and the etching rate was also below 2 nm/s, a good pattern could be formed. Results are shown in Table 1.

Example 12

A photocurable resin composition comprising 20 parts of A-NPG (product by Shin-Nakamura Chemical Col., Ltd.) as ethylene glycol di(meth)acrylate, 80 parts of VISCOAT 160 (product by Osaka Organic Chemical Co., Ltd.) as benzyl (meth)acrylate, 5 parts of Irgacure I-907 (product by Ciba Specialty Chemicals, Inc.) as photopolymerization initiator, and 0.1 part of MEGAFAC R-08 (product by Dainippon Ink and Chemicals, Inc.) as fluoric surfactant was prepared, and its viscosity, film thickness and etching rate were evaluated. As the kinetic viscosity of this resin was below 10 mPa·s and the etching rate was also below 2 nm/s, a good pattern could be formed. Results are shown in Table 1.

Example 13

A photocurable resin composition comprising 100 parts of VISCOAT 160 (product by Osaka Organic Chemical Co., Ltd.) as benzyl (meth)acrylate, 5 parts of Irgacure I-907 (product by Ciba Specialty Chemicals, Inc.) as photopolymerization initiator, and 0.1 part of MEGAFAC R-08 (product by Dainippon Ink and Chemicals, Inc.) as fluoric surfactant was prepared, and its viscosity, film thickness and etching rate were evaluated. As the kinetic viscosity of this resin was below 10 mPa·s and the etching rate was also below 2 nm/s, a good pattern could be formed. Results are shown in Table 1.

Comparative Example 1

A photocurable resin comprising 10 parts of BPE-500 (product by Shin-Nakamura Chemical Co., Ltd.) as (meth)acrylate compound, 90 parts of 1G (product by Shin-Nakamura Chemical Co., Ltd.) as ethylene glycol di(meth)acrylate, 5 parts of Irgacure I-907 (product by Ciba Specialty Chemicals, Inc.) as photopolymerization initiator, and 0.1 part of MEGAFAC R-08 (product by Dainippon Ink and Chemicals, Inc.) as fluoric surfactant was prepared, and its kinetic viscosity, film thickness and etching rate were evaluated. As the etching rate was over 2 nm/s, the resist was overetched and no good pattern transfer could be conducted. Results are shown in Table 1.

Comparative Example 2

A photocurable resin comprising 10 parts of BPE-500 (product by Shin-Nakamura Chemical Co., Ltd.) as (meth)

acrylate compound, 80 parts of 1G (product by Shin-Nakamura Chemical Co., Ltd.) as ethylene glycol di(meth)acrylate, 10 parts of adamantyl methacrylate (internal synthetic product) as adamantyl (meth)acrylate, 5 parts of Irgacure I-907 (product by Ciba Specialty Chemicals, Inc.) as photopolymerization initiator and 0.1 part of MEGAFAC R-08 (product by Dainippon Ink and Chemicals, Inc.) as fluoric surfactant was prepared, and its kinetic viscosity, film thickness and etching rate were evaluated. As the etching rate was over 2 nm/s, the resist was overetched and no good pattern transfer could be conducted. Results are shown in Table 1.

Comparative Example 3

A photocurable resin comprising 10 parts of BPE-500 (product by Shin-Nakamura Chemical Co., Ltd.) as (meth)acrylate compound, 30 parts of 1G (product by Shin-Nakamura Chemical Co., Ltd.) as ethylene glycol di(meth)acrylate, 60 parts of adamantyl methacrylate (internal synthetic product) as adamantly (meth)acrylate, 5 parts of Irgacure I-907 (product by Ciba Specialty Chemicals, Inc.) as photopolymerization initiator, and 0.1 part of MEGAFAC R-08 (product by Dainippon Ink and Chemicals, Inc.) as fluoric surfactant was prepared, and its kinetic viscosity, film thickness and etching rate were evaluated. As the kinetic viscosity was over 10 mPa·s, the base film thickness could not be reduced and no good pattern transfer could be conducted. Results are shown in Table 1.

Comparative Example 4

A photocurable resin comprising 10 parts of BPE-500 (product by Shin-Nakamura Chemical Co., Ltd.) as (meth)acrylate compound, 80 parts of 1G (product by Shin-Nakamura Chemical Co., Ltd.) as ethylene glycol di(meth)acrylate, 10 parts of adamantyl acrylate (internal synthetic product) as adamantly (meth)acrylate, 5 parts of Irgacure I-907 (product by Ciba Specialty Chemicals, Inc.) as photopolymerization initiator, and 0.1 part of MEGAFAC R-08 (product by Dainippon Ink and Chemicals, Inc.) as fluoric surfactant was prepared, and its kinetic viscosity, film thickness and etching rate were evaluated. As the etching rate was over 2 nm/s, no good pattern could be formed. Results are shown in Table 1.

Comparative Example 5

A photocurable resin comprising 10 parts of BPE-500 (product by Shin-Nakamura Chemical Co., Ltd.) as (meth)acrylate compound, 30 parts of 1G (product by Shin-Nakamura Chemical Co., Ltd.) as ethylene glycol di(meth)acrylate, 60 parts of adamantyl acrylate (internal synthetic product) as adamantly (meth)acrylate, 5 parts of Irgacure I-907 (product by Ciba Specialty Chemicals, Inc.) as photopolymerization initiator, and 0.1 part of MEGAFAC R-08 (product by Dainippon Ink and Chemicals, Inc.) as fluoric surfactant was prepared, and its kinetic viscosity, film thickness and etching rate were evaluated. As the viscosity was over 10 mPa·s, the base layer could not be reduced in thickness and no good pattern could be formed. Results are shown in Table 1.

As seen from the foregoing results, the photocurable resin according to the present invention is low in viscosity, enables a reduction of film thickness and is also capable of forming a fine structure. Further, the photocurable resin of this invention has excellent dry etching resistance, so that by using it as a resist material in working of the substrates, it is possible to work the substrates to a high degree of precision.

TABLE 1

|  | EXAMPLE 1 | EXAMPLE 2 | EXAMPLE 3 | EXAMPLE 4 | EXAMPLE 5 | EXAMPLE 6 | EXAMPLE 7 |
|---|---|---|---|---|---|---|---|
| BPE-500 | 10 | 10 | 10 | 10 | 10 | 10 | 10 |
| 1G | 60 | 30 | 30 | 40 | 30 | 30 | 60 |
| A-NPG |  |  |  |  |  |  |  |
| LIGHT-ESTER BZ | 30 | 60 |  |  |  |  |  |
| VISCOAT 160 |  |  |  |  |  |  |  |
| VISCOAT 155 |  |  | 60 |  |  |  |  |
| FA513A |  |  |  | 50 | 60 |  |  |
| FA511A |  |  |  |  |  | 60 |  |
| ADAMANTYLMETHACRYLATE |  |  |  |  |  |  |  |
| ADAMANTYLACRYLATE |  |  |  |  |  |  | 30 |
| IRGACURE I-907 | 5 | 5 | 5 | 5 | 5 | 5 | 5 |
| MEGAFAC R-08 | 0.1 | 0.1 | 0.1 | 0.1 | 0.1 | 0.1 | 0.1 |
| ohnishi P | 4.1 | 3.5 | 3.9 | 3.8 | 3.6 | 3.5 | 4.1 |
| ring P | 0.14 | 0.26 | 0.28 | 0.31 | 0.37 | 0.37 | 0.18 |
| VISCOSITY (mPa·s) | 5.6 | 5.6 | 5.6 | 10 | 11.6 | 16.4 | 9 |
| ETCHING RATE | 2 | 1.6 | 1.8 | 1.8 | 1.8 | 1.6 | 1.9 |
| FILM THICKNESS | 128 | 130 | 128 | 200 | 225 | 290 | 195 |
| PATTERN FORMABILITY | ○ | ○ | ○ | ○ | ○ | ○ | ○ |

|  | EXAMPLE 8 | EXAMPLE 9 | EXAMPLE 10 | EXAMPLE 11 | EXAMPLE 12 | EXAMPLE 13 |
|---|---|---|---|---|---|---|
| BPE-500 | 10 | 10 | 10 |  |  |  |
| 1G | 50 | 60 |  |  |  |  |
| A-NPG |  |  | 30 | 30 | 20 |  |
| LIGHT-ESTER BZ |  |  |  |  |  |  |
| VISCOAT 160 |  |  | 60 | 70 | 80 | 100 |
| VISCOAT 155 |  |  |  |  |  |  |
| FA513A |  |  |  |  |  |  |
| FA511A |  |  |  |  |  |  |
| ADAMANTYLMETHACRYLATE | 40 |  |  |  |  |  |
| ADAMANTYLACRYLATE |  | 30 |  |  |  |  |
| IRGACURE I-907 | 5 | 5 | 5 | 5 | 5 | 5 |
| MEGAFAC R-08 | 0.1 | 0.1 | 0.1 | 0.1 | 0.1 | 0.1 |
| ohnishi P | 4.0 | 4.1 | 3.4 | 3.3 | 3.1 | 2.8 |

TABLE 1-continued

| | | | | | | |
|---|---|---|---|---|---|---|
| ring P | 0.24 | 0.19 | 0.28 | 0.31 | 0.35 | 0.44 |
| VISCOSITY (mPa·s) | 9.8 | 10 | 3.8 | 3.6 | 3.5 | 3.2 |
| ETCHING RATE | 1.7 | 1.9 | 1.7 | 1.7 | 1.6 | 1.5 |
| FILM THICKNESS | 200 | 200 | 70 | 68 | 65 | 60 |
| PATTERN FORMABILITY | ○ | ○ | ○ | ○ | ○ | ○ |

| | COMPARATIVE EXAMPLE 1 | COMPARATIVE EXAMPLE 2 | COMPARATIVE EXAMPLE 3 | COMPARATIVE EXAMPLE 4 | COMPARATIVE EXAMPLE 5 |
|---|---|---|---|---|---|
| BPE-500 | 10 | 10 | 10 | 10 | 10 |
| 1G | 90 | 80 | 30 | 80 | 30 |
| A-NPG | | | | | |
| LIGHT-ESTER BZ | | | | | |
| VISCOAT 160 | | | | | |
| VISCOAT 155 | | | | | |
| FA513A | | | | | |
| FA511A | | | | | |
| ADAMANTYLMETHACRYLATE | | 10 | 60 | | |
| ADAMANTYLACRYLATE | | | | 10 | 60 |
| IRGACURE I-907 | 5 | 5 | 5 | 5 | 5 |
| MEGAFAC R-08 | 0.1 | 0.1 | 0.1 | 0.1 | 0.1 |
| ohnishi P | 4.7 | 4.5 | 3.6 | 4.5 | 3.6 |
| ring P | 0.02 | 0.07 | 0.35 | 0.08 | 0.37 |
| VISCOSITY (mPa·s) | 5.7 | 8.7 | 14.8 | 6.3 | 18.4 |
| ETCHING RATE | 2.6 | 2.1 | 1.7 | 2.2 | 1.6 |
| FILM THICKNESS | 129 | 190 | 280 | 130 | 310 |
| PATTERN FORMABILITY | X | Δ | X | Δ | X |

When forming a fine pattern on a substrate using the nanoprinting techniques, it is necessary to thin down the base layer between the convex portion of the mold and the substrate. With the prior art, however, it was impossible to thin the base layer as the initial film thickness was large because of solid form or high viscosity, and accordingly, use of resins as a resist material for optical nanoprinting for substrate working has been impossible. By using the photocurable resin materials according to the present invention, it is possible to provide a photocurable nanoprinting resin for high-precision working of substrates using optical nanoprinting techniques, said resin being very low in viscosity, capable of realizing a reduction of film thickness and having excellent dry etching resistance. It thus becomes possible to work the substrates with high precision by using optical nanoprinting techniques.

The invention claimed is:

1. A photocurable resin composition comprising a photopolymerization initiator and more than one (meth)acrylate monomer,
    wherein said more than one (meth)acrylate monomer includes either (i) a bifunctional (meth)acrylate monomer having a cyclic structure or (ii) a combination of a bifunctional (meth)acrylate monomer and a (meth)acrylate monomer having a cyclic structure,
    wherein the relation between the total atomic weight of the carbon atoms (Mcr) in said cyclic structure and the total atomic weight of the whole carbon (MTOT) in said composition meets Mcr/MTOT>0.1, and
    wherein the composition has a kinetic viscosity of 10 mPa·s or below.

2. A photocurable resin composition according to claim 1, wherein the (meth)acrylate monomer includes one of benzyl (meth)acrylate, cyclohexyl (meth)acrylate, cyclopentanyl (meth)acrylate, adamantyl (meth)acrylate, ethylene glycol di(meth)acrylate and cyclopentenyl (meth)acrylate.

3. A photocurable resin composition according to claim 1, wherein benzyl (meth)acrylate accounts for 30% by weight or more of the composition.

4. A photocurable resin composition according to claim 1, wherein said bifunctional (meth)acrylate monomer accounts for 70% by weight or less of the composition.

5. A photocurable resin composition according to claim 1, which further comprises a surfactant.

6. A photocurable resin composition according to claim 5, wherein said surfactant is a fluoric surfactant.

7. A photocurable resin composition according to claim 6, wherein said fluoric surfactant is included in an amount of 0.01 to 1% by weight of the whole composition.

8. A photocurable resin composition according to claim 1, wherein a minimum kinetic viscosity of the photocurable resin composition is a kinetic viscosity such that the photocurable resin composition can be formed into a photocurable resin film on which a fine pattern can be formed by press-contacting with a face of a mold.

9. A photocurable resin composition according to claim 1, which is free of solvent separate from the photopolymerization initiator and the more than one (meth)acrylate monomer.

10. A photocurable resin composition according to claim 9, wherein the photocurable resin composition is liquid at room temperature.

11. A method for forming a pattern comprising the steps of:
    forming on a substrate surface a film of a solvent-free photocurable resin composition containing a photopolymerization initiator and a (meth)acrylate monomer and/or oligomer having a cyclic structure, wherein the carbon atoms in said cyclic structure and the whole carbon atoms in the composition satisfy the relation (1) specified below:
    (1) the relation between the total atomic weight of the carbon atoms (Mcr) in said cyclic structure and the total atomic weight of the whole carbon (MTOT) in said composition meets Mcr/MTOT>0.1;
    press-contacting a face of a mold with a fine pattern formed thereon against a surface of said film of photocurable resin composition; and
    curing said film of photocurable resin composition by irradiation with light to form a fine pattern.

12. A method for forming a pattern comprising the steps of:
    forming on a substrate surface a film of a solvent-free photocurable resin composition containing a photopolymerization initiator and a (meth)acrylate monomer and/or oligomer having a cyclic structure, wherein the relation between the total atomic weight of the carbon atoms (Mcr) in said cyclic structure and the total atomic weight of the whole carbon (MTOT) in said composition meets Mcr/MTOT>0.1, and wherein said resin composition has a kinetic viscosity of 10 mPa·s or below;

press-contacting a face of a mold with a fine pattern formed thereon against a surface of said film of photocurable resin composition; and curing said film of photocurable resin composition by irradiation with light to transfer the fine pattern to said film of photocurable resin composition.

13. The method for forming a pattern according to claim 11, wherein said (meth)acrylate monomer is one of benzyl (meth)acrylate, cyclohexyl (meth)acrylate, cyclopentanyl (meth)acrylate, adamantyl (meth)acrylate, ethylene glycol di(meth)acrylate and cyclopentenyl (meth)acrylate.

14. The method for forming a pattern according to claim 11, wherein benzyl (meth)acrylate accounts for 30% by weight or more of the composition.

15. The method for forming a pattern according to claim 11, wherein a bifunctional (meth)acrylate is contained as said (meth)acrylate monomer in the composition.

16. The method for forming a pattern according to claim 11, wherein said bifunctional (meth)acrylate monomer accounts for 70% by weight or less of said resin composition.

17. The method for forming a pattern according to claim 11, wherein said resin composition has a kinetic viscosity of 10 mPa·s or below.

18. The method for forming a pattern according to claim 12, wherein said (meth)acrylate monomer is one of benzyl (meth)acrylate, cyclohexyl (meth)acrylate, cyclopentanyl (meth)acrylate, adamantyl (meth)acrylate, ethylene glycol di(meth)acrylate and cyclopentenyl (meth)acrylate.

19. The method for forming a pattern according to claim 12, wherein benzyl (meth)acrylate accounts for 30% by weight or more of the composition.

20. The method for forming a pattern according to claim 12, wherein a bifunctional (meth)acrylate is contained as said (meth)acrylate monomer in the composition.

21. The method for forming a pattern according to claim 12, wherein said bifunctional (meth)acrylate monomer accounts for 70% by weight or less of said resin composition.

* * * * *